(12) United States Patent
Inoue

(10) Patent No.: US 7,185,311 B2
(45) Date of Patent: Feb. 27, 2007

(54) MASK EVALUATING METHOD, MASK EVALUATING SYSTEM, METHOD OF MANUFACTURING MASK AND COMPUTER PROGRAM PRODUCT

(75) Inventor: Mari Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 158 days.

(21) Appl. No.: 10/976,001

(22) Filed: Oct. 29, 2004

(65) Prior Publication Data
US 2005/0132322 A1    Jun. 16, 2005

(30) Foreign Application Priority Data
Oct. 31, 2003    (JP)    ............................. 2003-372441

(51) Int. Cl.
*G06F 17/50*    (2006.01)
(52) U.S. Cl. ................................ 716/19; 716/4; 716/21
(58) Field of Classification Search .................... 716/2, 716/4, 19, 20, 21
See application file for complete search history.

(56) References Cited

U.S. PATENT DOCUMENTS 6,324,481 B1 *   11/2001   Atchison et al. ............... 702/84
6,711,733 B2     3/2004    Noda
2004/0115541 A1 * 6/2004   Yamaguchi et al. .......... 716/21

FOREIGN PATENT DOCUMENTS

| JP | 2002-100548 | 4/2002 |
|----|-------------|--------|
| JP | 2003-066590 | 3/2003 |

* cited by examiner

*Primary Examiner*—Thuan Do
(74) *Attorney, Agent, or Firm*—Finnegan, Henderson, Farabow, Garrett & Dunner, L.L.P.

(57) ABSTRACT

A photomask evaluating method comprises calculating a killer defect rate function with respect to a simulative defect pattern including a pattern of photomask and a plurality of defects, the killer defect rate function representing a killer defect rate of the simulative defect pattern with respect to a desired density of the pattern and a desired size of the plurality of defects, calculating the number of killer defects in an inspection region of the photomask based on an area of the photomask inspection region, a pattern density in the inspection region, the killer defect rate function and a defect size distribution representing the number of defects per unit area to a defect size range acquired from a photomask manufacturing step, and evaluating the photomask based on the calculated number of the killer defects.

15 Claims, 4 Drawing Sheets

MASK EVALUATING METHOD, MASK EVALUATING SYSTEM, METHOD OF MANUFACTURING MASK AND COMPUTER PROGRAM PRODUCT

CROSS-REFERENCE TO RELATED APPLICATIONS

This application is based upon and claims the benefit of priority from prior Japanese Patent Application No. 2003-372441, filed Oct. 31, 2003, the entire contents of which are incorporated herein by reference.

BACKGROUND OF THE INVENTION

1. Field of the Invention

The present invention relates to mask evaluating method, mask evaluating system, method of manufacturing mask and computer program product used in a lithography process.

2. Description of the Related Art

As a pattern of semiconductor device is miniaturized, a patterns on the photomask (mask pattern), which is a master of a circuit pattern formed on a wafer is also miniaturize. The micro-fabricated mask pattern requires strict dimension accuracy and defect specifications. For this reason, it is difficult to highly secure a yield of the photomask including the foregoing micro-fabricated mask pattern.

If the yield of the photomask is reduced, a necessity period for manufacturing (manufacture period) the required number of good photomasks becomes longer. The change of the manufacture period gives an influence to the device manufacture planning. For example, the efficiency of development and trial of device is reduced. In order to avoid such a disadvantage, there is need of making a device manufacture plan after predicting the yield of the photomask and estimating the mask manufacture period.

As one of the photomask yield predicting methods, a critical area analysis has been known in the prior art. A description relating to the critical area analysis is disclosed in the JPN. PAT. APPLN. KOKAI Publication No. 2002-100548. The critical area means an area to be a defect which causes a fatal failure such as a short between lines on the wafer if a center of a foreign matter which is dropped on a pattern exist as a defect. This kind of defect to be the fatal failure is called a killer defect.

The method is also applicable to the photomask. That is, the number of killer defects λ and a mask yield Y can be determined from the following definitions using a critical area with respect to a particle size calculated based on mask pattern data of a desired semiconductor product and a defect size distribution calculated based on defect date obtained in step of manufacturing the photomask.

$\lambda = \int_R Ac(R) \cdot D(R) dR$ $Y = \exp(-\lambda)$ where,
Ac(R): critical area
D(R): defect size distribution
R: defect size In the defect on the photomask, there exists a defect, which is capable of being saved by defect repair. Therefore, the defect is not regarded as the killer defect. In a case that the method of predicting the yield of the photomask using the conventional critical area analysis (calculation) is performed, the defect capable of being saved by defect repair is determined as the killer defect. For this reason, the difference inevitably occurs between predictive and actual yields. As a method to avoid the case, there is a provided a method of predicting a yield of a mask considering the pattern rescue probability for the defect on the photomask is disclosed in the JPN. PAT. APPLN. KOKAI Publication No. 2003-66590.

Semiconductor devices including kinds of devices are formed on the wafer. These devices include layers. For this reason, the number of kinds of data of photomask required to form all kinds of device on the wafer reaches to the huge value. Usually, some photomasks are only formed for each semiconductor device. That is, the photomask is extremely a large item small volume production. The required precision of the photomask extends wide range from a low required precision to high required precision. Therefore, performing the critical analysis with respect to all mask patterns is not always required and takes lots of analysis time, there is a problem in the photomask production

BRIEF SUMMARY OF THE INVENTION

According to an aspect of the present invention, there is provided a mask evaluating method comprising: calculating a killer defect rate function with respect to a simulative defect pattern including a pattern of photomask and a plurality of defects, the killer defect rate function representing a killer defect rate of the simulative defect pattern with respect to a desired density of the pattern and a desired size of the plurality of defects; calculating the number of killer defects in an inspection region of the photomask based on an area of the photomask inspection region, a pattern density in the inspection region, the killer defect rate function and a defect size distribution representing the number of defects per unit area to a defect size range acquired from a photomask manufacturing step; and evaluating the photomask based on the calculated number of the killer defects.

According to an aspect of the present invention, there is provided a mask evaluating system comprising: a killer defect rate function calculating section for calculating a killer defect rate function with respect to a simulative defect pattern including a pattern of photomask and a plurality of defects, the killer defect rate function representing a killer defect rate of the simulative defect pattern with respect to a desired density of the pattern and a desired size of the plurality of defects; a killer defect calculating section for calculating the number of killer defects in an inspection region of the photomask based on an area of the inspection region, a pattern density in the inspection region, the killer defect rate function and a defect size distribution representing the number of defects per unit area to a defect size range acquired from a photomask manufacturing step; and an evaluation section for evaluating the photomask based on the calculated number of killer defects.

According to an aspect of the present invention, there is provided a method of manufacturing a mask including manufacturing a predetermined number of good photomask, comprising: evaluating the photomask using a method of manufacturing a mask described in any one of claims 1 to 15; determining the number of photomask to be manufactured required for obtaining the predetermined number or more of good photomask based on a result of the evaluating the photomask; and manufacturing the photomask by the number of photomask to be manufactured.

According to an aspect of the present invention, there is provided a computer program product configured to store program instruction for execution on the computer system enabling the computer system to perform: calculating a killer defect rate function with respect to a simulative defect pattern including a pattern of photomask and a plurality of defects, the killer defect rate function representing a killer defect rate of the simulative defect pattern with respect to a desired density of the pattern and a desired size of the plurality of defects; calculating the number of killer defects in an inspection region of the photomask based on an area of the inspection region, a pattern density in the inspection region, the killer defect rate function and a defect size distribution representing the number of defects per unit area to a defect size range acquired from a photomask manufacturing step; and evaluating the photomask based on the calculated number of the killer defects.

DETAILED DESCRIPTION OF THE INVENTION

Embodiments of the present invention Will be described below with reference to the accompanying drawings.

(First embodiment)

Figure 1:
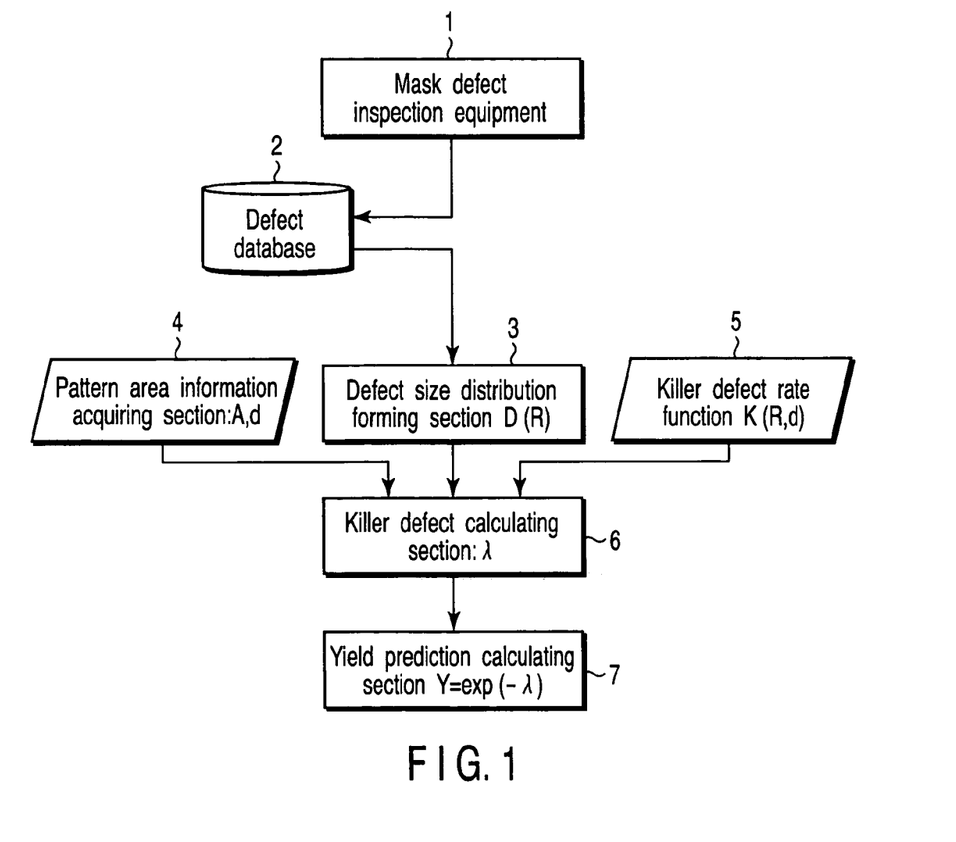
FIG. 1 is a block diagram showing the configuration of a mask yield predicting system according to an embodiment.

FIG. 1 is a block diagram showing a mask evaluation system according to the first embodiment of the present invention.

The mask evaluation system according to the present embodiment comprises:

a mask defect inspection equipment 1 which inspects defects on a photomask, a defect database 2 which is stored with defect data relating to the photomask acquired by the mask defect inspection equipment 1, a defect size distribution forming section 3 which forms a defect size distribution D(R) representing the number of defects per unit area on the photomask to a defect size R thereon based on the defect data stored in the defect database 2, a pattern area information acquiring section 4 which acquires information including an area A of a main pattern area (region requiring predetermined defect accuracy (=region subjected to defect inspection) and a pattern density d in the foregoing main pattern area, a killer defect rate function calculating section 5 which calculates a killer defect rate function (R, D) representing a killer defect rate of the simulative defect pattern with respect to a desired density of the pattern (pattern density) d and a desired size of the plurality of defects (defect size) R with respect to a simulative defect pattern including a pattern (simulative pattern) and a plurality of defects (simulative defects), a killer defect calculating section 6 which calculates the number of killer defects $\lambda$ of the photomask based on the information (area A, pattern density d) of a main pattern area of the photomask, the defect size distribution D(R), and the killer defect rate function K(R, d).

a yield prediction calculating section 7 (evaluation section) which performs a yield prediction calculation Y (=exp($-\lambda$)) of the photomask based on the number of killer defects $\lambda$.

The defect data stored in the defect database 2 is acquired from a process of the photomask.

According to the present embodiment, the section 5 calculates the killer defect rate function K(R, d) representing the killer defect rate of the simulative defect pattern with respect to the desired density d and the defect size R., the killer defect calculating section 6 calculates the number of killer defects in the main pattern area of the photomask based on the information (area A, pattern density d) of the main pattern of the photomask, the defect size distribution D(R) and the killer defect rate function K(R, d), and the yield prediction calculating section 7 predicts the yield of the photomask using the number of killer detects thus calculated. The details of the present embodiment will be described below.

Figure 2:
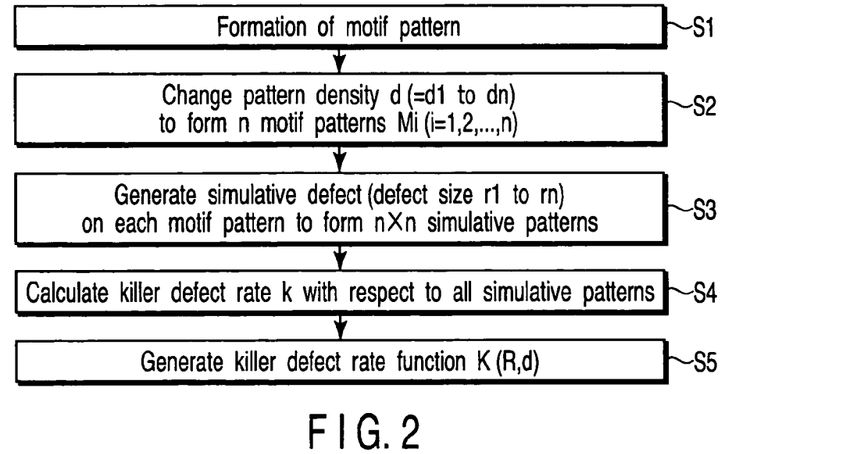
FIG. 2 is a flowchart showing a method of calculating a killer defect rate function K(R, d) according to the embodiment.

FIG. 2 is a flowchart showing the method of calculating the killer defect rate function K(R, d).

Figure 3:
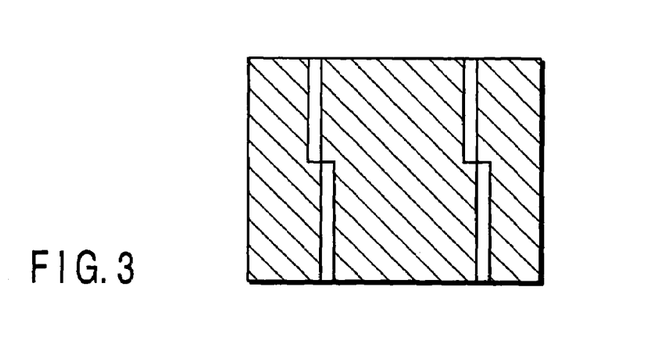
FIG. 3 is a view showing a motif pattern according to the embodiment.

First, a layout pattern (motif pattern) to be a motif is formed (step S1). FIG. 3 shows an example of the motif pattern. The motif pattern of the FIG. 3 shows a repeated pattern on an actual photomask.

By using the pattern on the actual photomask, it makes possible to increase an accuracy of the yield prediction. In addition, By using the repeated pattern as the motif, it makes possible to reduce calculation amount required for the yield prediction. Therefore, the motif pattern shown in FIG. 3 is a pattern effective for making high-accurate mask evaluation with less calculation amount.

Figure 4:
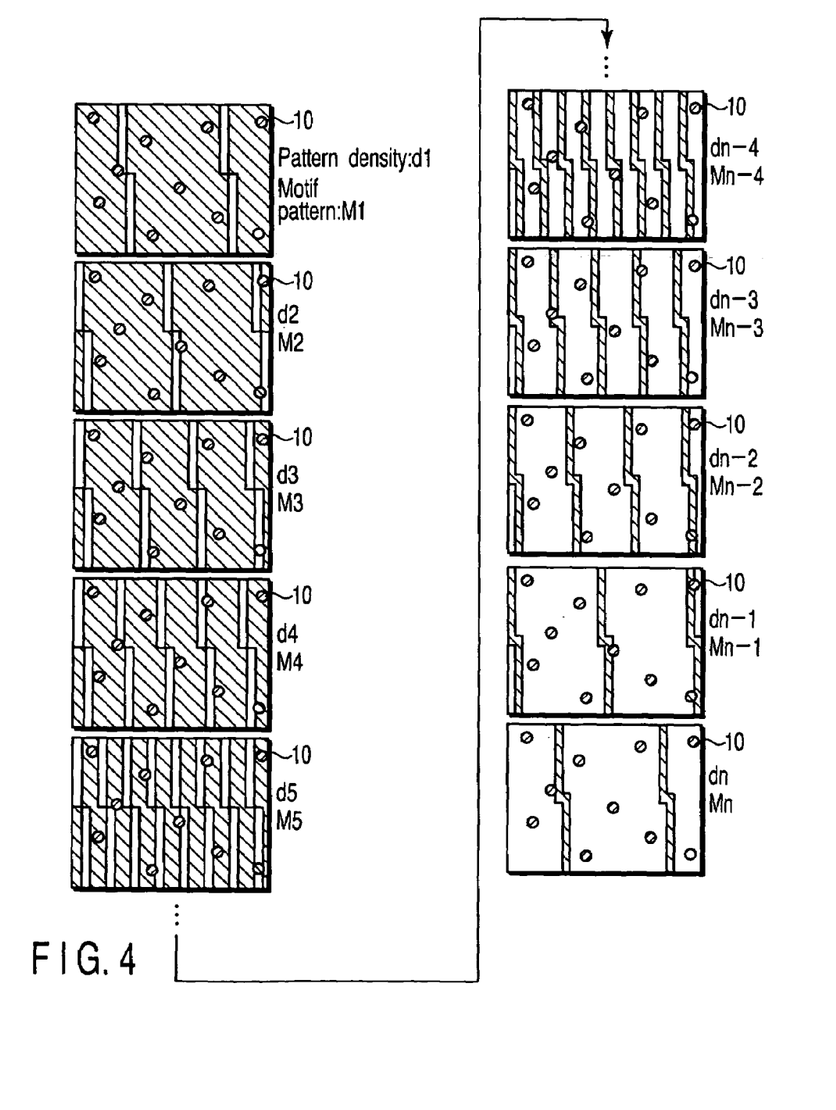
FIG. 4 is a top plan view showing a motif pattern Mi (i=1, 2, . . . n) according to the embodiment.

As shown in FIG. 4, by changing the number of repeated patterns in the motif pattern, n pieces of motif patterns M (=Mi (i=1, 2, . . . n) having changed pattern density d (=di (i=1, 2, . . . n) in the motif pattern are formed (step S2). Here, changing the pattern density means to reflect actual pattern having a variety of pattern on the motif pattern.

As seen from FIG. 4, simulative defects 10 having a size r1 are generated on the motif pattern (pattern image) Mi (i=1, 2, . . . n) at random (and simulatively). Thus, n pieces of simulative defect patterns include motif pattern and simulative defects are formed. Likewise, simulative defects 10 having size r2 to rn are generated on the motif pattern Mi (i=1, 2, . . . n) at random. In the manner described above, n×n pieces of simulative defect patterns which are differing each other in at least one of motif pattern and defect size are formed (step S3). The simulative defect is generated using a Monte Carlo method, for example. Here, the simulative defects are generated by using the Monte Carlo method, any other methods capable of generating simulative defects at random can be used.

The simulative defects in the simulative defect pattern are classified into the following three kinds (D1 to D3) based on the defect saving rule. The defect saving rule is based on the inspection sensitivity of the mask inspector equipment, and defect repair possibility and defect repair accuracy of a defect repair equipment. Further, the motif pattern, the size of the simulative defect, and position of the simulative defect are used to classify the simulative defects based on the defect saving rule.

D1: out-of-object defect (nontarget defect); defect hidden in pattern, defect smaller than inspection sensitivity of inspection equipment (not detected by the inspection equipment).

D2: repairable defect; defect which is other than the out-of-object defect and repairable by considering capability and accuracy of the defect repair equipment.

D3: non-repairable defect; defect which is other than the out-of-object defect and non-repairable by considering capability and accuracy of the defect repair equipment.

The inspection sensitivity is variable depending on the specifications of the photomask. For example, the photomask having higher accuracy needs to be inspected smaller defect, then the inspection sensitivity becomes higher. Therefore, there is a case that the number of D1 to D3 defects change if the inspection sensitivity varied due to the specifications of the photomask.

Next, the total number of non-repairable defects is determined. Among the repairable defect, a defect having high repair difficulty has a possibility to be defect even after repair is performed. So, in the present embodiment, the following total number of non-repairable defects is employed taking a repair failure probability of the repairable defects into consideration.

Total number of non-repairable defects=number of repairable defects x repair failure probability+number of non-repairable defects Next, the killer defect rate (rate of defect which can not be saved) k is calculated using the total number of non-repairable defects and the total number of generated defects (in this case, n defects (=number of simulative defects)).

Killer defect rate k=total number of non-repairable defects/total number of generated defects.

The killer defect rate k is calculated with respect to all of n×n (number of kinds of pattern density×number of kinds of defect size) simulative defect patterns (step S4). Next, the killer defect rate k of simulative pattern which has the pattern density other than the pattern density d (=d1, d2, ... dn) or the defect size other than defect size r1 to rn is determined by fitting (extrapolation), and the killer defect rate function K(R, d) is generated (step S5). The killer defect rate function K(R, d) can be represented as a distribution map shown in FIG. 5.

In the present embodiment, the killer defect rate function K(R, d) is calculated using the single motif pattern, however, the killer defect rate function K(R, d) can be calculated using a plurality of motif patterns which are different each other. In this case, at first, the killer defect rate k is calculated for each of the plurality of motif patterns respectively according to the steps. Next, a mean value km of a plurality of killer defect rates k in respect to pattern density dx and defect size rx which are obtained from the plurality of motif patterns is calculated, and the killer defect rate function K(R, d) is determined by extrapolation using the km as the killer defect rate.

Next, the method of predicting the yield of the photomask of the present embodiment is explained.

At first, information on the area A of the main pattern area and pattern density d in the main pattern area is acquired by the information acquiring section 4.

Figure 6:
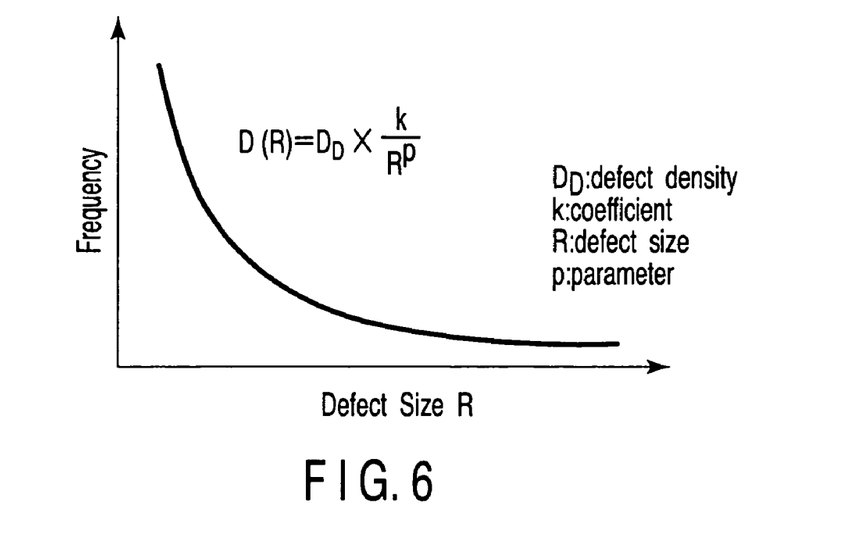
FIG. 6 is a graph of a defect size distribution according to the embodiment.

Next, defect size distribution D(R) per unit area in the mask manufacturing process is calculated according to the known method using defect data stored in the defect database 2. FIG. 6 shows an example of the defect size distribution D(R).

Next, the number of killer defects λ is calculated from the following equation using the killer defect rate function K(R, d) determined before.

$$\lambda = \int_R A \cdot K(R, d) \cdot D(R) dR$$

$$= A \left\{ \int_R K(R, d) \cdot Ds(R) dR + \int_R K(R, d) \cdot Dl(R) dR \right\}$$

$$D(R) = Ds(R) + Dl(R)$$

where,

Ds(R): size distribution of small defect having defect size less than predetermined value (e.g., 3 μm)

Dl(R): size distribution of large defect having defect size not less than predetermined value (e.g., 3 μm)

In the present embodiment, the defect size distribution D(R) is classified into small and large defect size distributions Ds(R) and Dl(R). The reason is that the extrapolation accuracy of D(R) can be raised. In particular, the extrapolation accuracy of the large defect size distribution Dl(R) can be raised.

As the killer defect number λB for black defects and killer defect number λw for white defects can be calculated respectively, the sum of the killer defect number λB and λw can be used as the killer defect number λ. The killer defect number λB and λw are respectively calculated by determining the killer defect rate function for each of the black and white defects, and acquiring the defect size distribution for each of the black and white defects.

The black defect is a remained light shielding film or half transparent film remained on a pattern where the light shielding film or half transparent film should be removed. The black defect is a remained light shielding film or half transparent film remained on a pattern where the light shielding film or half transparent film should be removed. The white defect is a removed light shielding film or half transparent film remained on a pattern where the light shielding film or half transparent film should be remained.

The yield is predicted from the following equation using the number of killer defects λ thus determined.

$$Y=\exp(-\lambda)$$

Thus, according to the present embodiment, the area, pattern density and defect size distribution of the main pattern area of the photomask are determined, thereby the yield of the photomask can be predicted.

The acquisition of the area and pattern density in the main pattern area foregoing area can be performed much easier than the calculation of the critical area. The killer defect rate function K(R, d) is easily determined, and used in common to mutually different photomasks, then, there is no need of calculating the killer defect rate function K(R, d) for each photomask. Consequently, according to the present embodiment, it is possible to realize the method of predicting the yield of the photomask, which can improve the production efficiency of the photomask.

Moreover, according to the present embodiment, the total number of non-repairable defects is employed taking the repair failure probability of the repairable defects into consideration, then, it is possible to realize the high accurate method of predicting the yield of photomask. In addition, classifying the defect size distribution D(R) into small and large defect size distributions Ds(R) and Dl(R) also contributes to the improvement of the accuracy of the method of predicting the yield.

Moreover, by using the predicted yield of the photomask, the ordered N (N≧1) pieces of photomasks are easily delivered within the date of delivery. Because the number of transparent substrates or mask blanks required for obtaining N good photomasks used in the photomask manufacture process can be easily and accurately predicted.

Moreover, by using the predicted yield of the photomask, the proper mask price can be decided. Because it is possible to predict how many mask of M transparent substrates or mask blanks used in the photomask manufacture process is finished as good photomask.

Moreover, a mask manufacturing method including a step of manufacturing a predetermined number of good photomasks using the mask evaluating method of the present embodiment is as follows. That is, the mask manufacturing method comprises a step for evaluating the photomask using the mask evaluating method of the present embodiment, a step for deciding the number of the photomask to be manufactured required for obtaining the predetermined number of good photomasks or more based on the result of the step of evaluating the photomask (yield predicted result), and a step for manufacturing the decided number of the photomask.

By adopting the mask manufacturing method, the ordered N (N≧1) pieces of photomasks can be easily delivered within the date of delivery or the proper mask price can be decided.

(Second embodiment)

Figure 7:
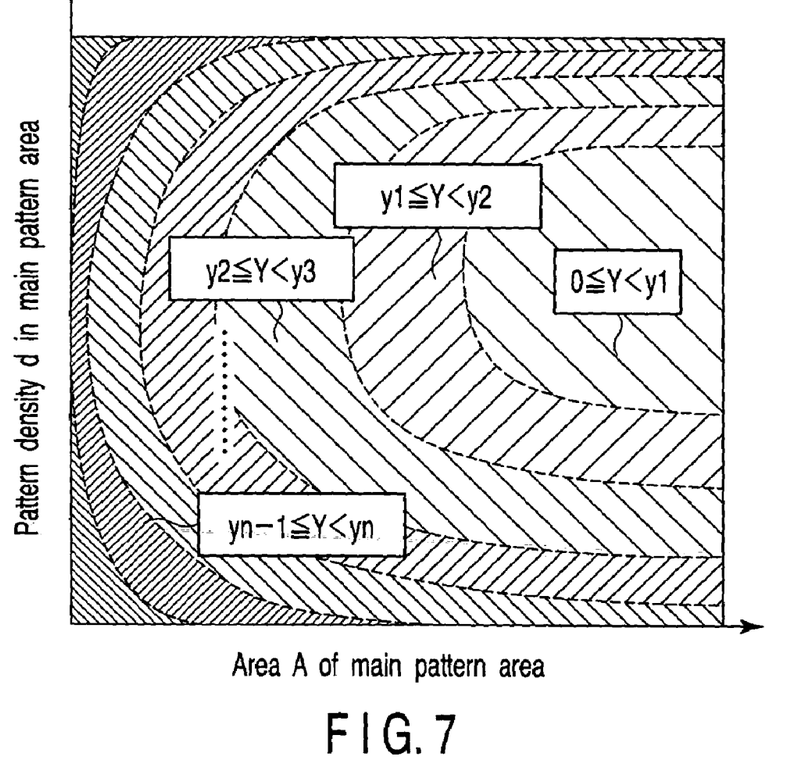
FIG. 7 is a yield map according to an embodiment.

As described in the first embodiment, the predicted yield Y is given by the equation Y=epx(−λ), the number of killer defects λ is given by the equation $\lambda = \int_R A \cdot K(R, d) \cdot D(R) \, dR$. Therefore, the predicted yield Y can be easily represented as a yield distribution expressed by a function using pattern area A and pattern density d as parameters. An example of yield map expressing the yield distribution is shown in FIG. 7.

The evaluation of the yield of the photomask using the yield map is carried out as follows.

The predicted yield Y is acquired every predetermined period. A yield map is generated from the acquired predicted yield Y every predetermined period. From these yield maps, s variable tendency in time of the whole yields is analyzed. Further, by paying attention to the pattern density d or pattern area A in a low yield range, the yield map of each period is compared and analyzed. An example of the analysis will be explained below.

Figure 5:
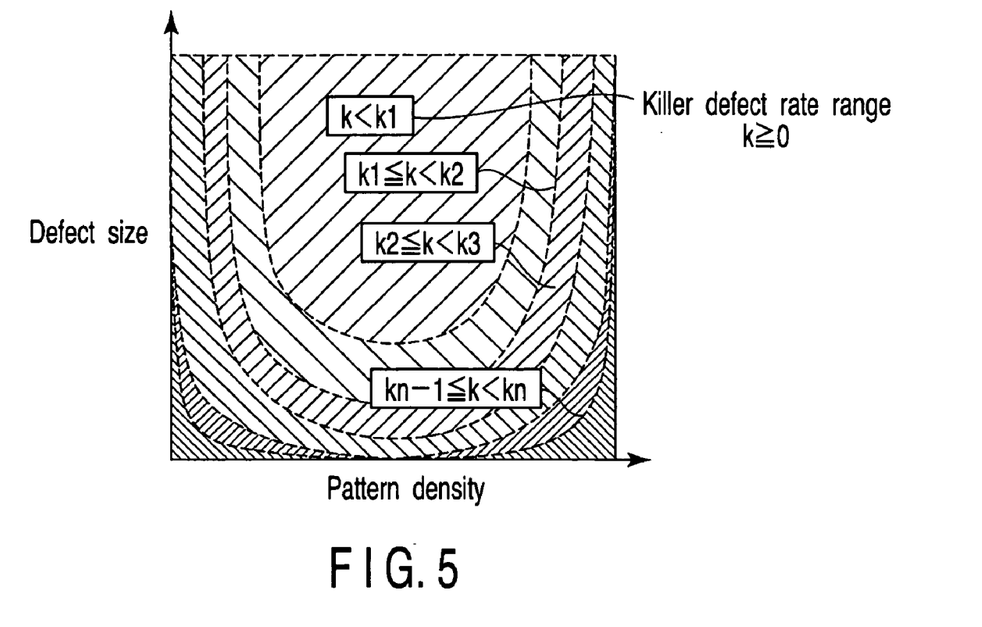
FIG. 5 is a distribution graph representing the killer defect rate function K(R, d) according to the embodiment.

In case of the predicted yield Y obtained using the killer defect rate function in the FIG. 5, it is analyzed that the yield of photomask tends to decrease as the pattern density becomes high and the pattern area becomes large.

Moreover, in case that the killer defect rate function K(R, d) is fixed, the yield distribution is variable depending on the defect size distribution D(R). The defect size distribution D(R), namely, the shape of the yield map changes by the variation of process defect level. Therefore, for example, if the process defect level is decreased, there is a tendency that the ratio of occupation of a low yield range on the yield map becomes larger. Not only the variation of the whole yields, but also the feature of the variation of the yield by the difference of the kind of pattern (pattern density d in this case) or the variation of the process defect level can be associated with the yield map, and the yield of the photomask is evaluated.

Further, by using the defect size distribution D(R) inversely calculated by using the killer defect rate function K(R, d) and the yield distribution, the process capacity of the photomask manufacture process can be evaluated.

Figure 8:
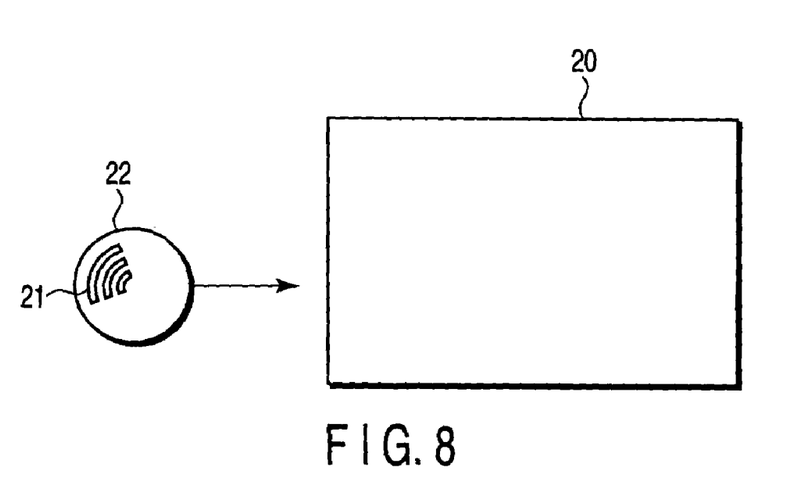
FIG. 8 is a view to explain a computer readable recording medium according to an embodiment.

Moreover, as shown in FIG. 8, the present invention can be carried out as a computer program product (e.g., CD-ROM, DVD) 22 which records a program 21 for executing the photomask evaluating method of the present embodiment to a system including a computer 20.

Namely, the computer program product is configured to store program instruction for execution on the computer system enabling the computer system to perform: calculating a killer defect rate function with respect to a simulative defect pattern including a pattern of photomask and a plurality of defects, the killer defect rate function representing a killer defect rate of the simulative defect pattern with respect to a desired density of the pattern and a desired size of the plurality of defects; calculating the number of killer defects in an inspection region of the photomask based on an area of the inspection region, a pattern density in the inspection region, the killer defect rate function and a defect size distribution representing the number of defects per unit area to a defect size range acquired from a photomask manufacturing step; and evaluating the photomask based on the calculated number of the killer defects. The computer program product can further include other instructions described in the foregoing embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask evaluating method comprising:
   calculating a killer defect rate function with respect to a simulative defect pattern including a pattern of photomask and a plurality of defects, the killer defect rate function representing a killer defect rate of the simulative defect pattern with respect to a desired density of the pattern and a desired size of the plurality of defects;
   calculating the number of killer defects in an inspection region of the photomask based on an area of the photomask inspection region, a pattern density in the inspection region, the killer defect rate function and a defect size distribution representing the number of defects per unit area to a defect size range acquired from a photomask manufacturing step; and
   evaluating the photomask based on the calculated number of the killer defects,
   wherein calculating the killer defect rate function comprises:
   forming a plurality of simulative defect patterns including a pattern and a plurality of defects, the plurality of simulative defect patterns differing from each other in at least one of a pattern density in the pattern and a size of the defects;
   calculating a killer defect rate for each of the plurality of simulative defect patterns; and
   calculating a killer defect rate function of the simulative defect patterns with respect to a desired pattern density in the pattern and a desired size of the defects by extrapolation using the killer defect rates of the plurality of simulative defect patterns.

2. The method according to claim 1, further comprising: evaluating a yield of the photomask based on the calculated number of killer defects of the photomask.

3. The method according to claim 1, wherein forming the plurality of simulative defect patterns comprises:
performing a process including generating a plurality of defects having a predetermined size simulatively and randomly on a pattern image of a photomask having a predetermined pattern density multiple times by changing at least one of the predetermined pattern density and the defect size for each of the times.

4. The method according to claim 3, wherein the pattern includes a repeated pattern.

5. The method according to claim 1, wherein calculating the killer defect rate function comprises:
acquiring the number of repairable defects and non-repairable defects from each of the plurality of simulative defect patterns; and
calculating a killer defect rate for each of the plurality of simulative defect patterns based on the number of repairable defects, the number of non-repairable defects, and the number of the plurality of defects.

6. The method according to claim 5, wherein the killer defect rate for each of the plurality of simulative defect patterns is calculated based on the expression given below
(the number of repairable defects H repair failure probability+the number of non-repairable defects)/the number of the defects.

7. The method according to claim 6, wherein the number of killer defects in the inspection region of the photomask is calculated based on the following equation:

$$\lambda = I_R A \cong K(R, d) \cong D(R) dR$$

where
$\lambda$: Number of killer defects
A: Area of inspection region
K(R, d): Killer defect rate function
R: Defect size
d: pattern density
D(R): Defect size distribution.

8. The method according to claim 1, wherein the number of killer defects in the inspection region of the photomask is calculated based on the following equation:

$$\lambda = I_R A \cong K(R, d) \cong D(R) dR$$

where
$\lambda$: Number of killer defects
A: Area of inspection region
K(R, d): Killer defect rate function
R: Defect size
d: pattern density
D(R): Defect size distribution.

9. The method according to claim 1, wherein the defect size distribution includes a plurality of defect size distributions having mutually different defect size range.

10. The method according to claim 1, wherein calculating the killer defect number comprises:
calculating killer defect numbers each of black and white defects; and
calculating sum of the killer defect numbers of the black and white defects.

11. The method according to claim 1, wherein evaluating the photomask comprises:
forming a photomask yield distribution using a pattern density and an area of the photomask as parameters every predetermined period; and
comparing the photomask yield distribution prepared every predetermined period to evaluate a yield variation.

12. The method according to claim 11, further comprising: calculating a defect size distribution in a photomask manufacturing process based on the photomask yield distribution, and estimating a process capacity of the photomask manufacturing process.

13. A method of manufacturing a mask including manufacturing a predetermined number of good photomask, comprising:
evaluating the photomask using a method of manufacturing a mask described in any one of claims 1, 2, or 3 to 12;
determining the number of photomask to be manufactured required for obtaining the predetermined number or more of good photomask based on a result of the evaluating the photomask; and
manufacturing the photomask by the number of photomask to be manufactured.

14. A mask evaluating method comprising:
calculating a killer defect rate function with respect to a simulative defect pattern including a pattern of photomask and a plurality of defects, the killer defect rate function representing a killer defect rate of the simulative defect pattern with respect to a desired density of the pattern and a desired size of the plurality of defects;
calculating the number of killer defects in an inspection region of the photomask based on an area of the photomask inspection region, a pattern density in the inspection region, the killer defect rate function and a defect size distribution representing the number of defects per unit area to a defect size range acquired from a photomask manufacturing step; and
evaluating the photomask based on the calculated number of the killer defects
wherein the number of killer defects in the inspection region of the photomask is calculated based on the following equation:

$$\lambda = I_R A \cong K(R, d) \cong D(R) dR$$

where
$\lambda$: Number of killer defects
A: Area of inspection region
K(R, d): Killer defect rate function
R: Defect size
d: pattern density
D(R): Defect size distribution.

15. A mask evaluating method comprising:
calculating a killer defect rate function with respect to a simulative defect pattern including a pattern of photomask and a plurality of defects, the killer defect rate function representing a killer defect rate of the simulative defect pattern with respect to a desired density of the pattern and a desired size of the plurality of defects;
calculating the number of killer defects in an inspection region of the photomask based on an area of the photomask inspection region, a pattern density in the inspection region, the killer defect rate function and a defect size distribution representing the number of defects per unit area to a defect size range acquired from a photomask manufacturing step;

evaluating the photomask based on the calculated number of the killer defects; and evaluating a yield of the photomask based on the calculated number of killer defects of the photomask, wherein the number of killer defects in the inspection region of the photomask is calculated based on the following equation:

$$\lambda = I_R A \cong K(R, d) \cong D(R) dR$$

where $\lambda$: Number of killer defects
A: Area of inspection region
K(R, d): Killer defect rate function
R: Defect size
d: pattern density
D(R): Defect size distribution.

* * * * *

UNITED STATES PATENT AND TRADEMARK OFFICE
CERTIFICATE OF CORRECTION

PATENT NO. : 7,185,311 B2  Page 1 of 1
APPLICATION NO. : 10/976001
DATED : February 27, 2007
INVENTOR(S) : Inoue It is certified that error appears in the above-identified patent and that said Letters Patent is hereby corrected as shown below:

* Claim 7, column 9, line 32, change "$\lambda = I_R A \cong K(R, d) \cong D(R) dR$" to --$\lambda = I_R A \cong K(R, d) \cong D(R) \, dR$--.

* Claim 8, column 9, line 45, change "$\lambda = I_R A \cong K(R, d) \cong D(R) dR$" to --$\lambda = I_R A \cong K(R, d) \cong D(R) \, dR$--.

Claim 13, column 10, line 11, change "photomask," to --photomasks,--.

Claim 13, column 10, line 16, change "photomask" to --photomasks--.

Claim 13, column 10, line 18, change "photomask" to --photomasks--.

Claim 13, column 10, lines 21-22, change "number of photomask" to --number of photomasks--.

* Claim 14, column 10, line 39, change "defects" to --defects,--.

* Claim 14, column 10, line 43, change "$\lambda = I_R A \cong K(R, d) \cong D(R) dR$" to --$\lambda = I_R A \cong K(R, d) \cong D(R) \, dR$--.

* Claim 15, column 11, line 8, change "$\lambda = I_R A \cong K(R, d) D(R) dR$" to --$\lambda = I_R A \cong K(R, d) \cong D(R) \, dR$--.

Signed and Sealed this

First Day of May, 2007

JON W. DUDAS
*Director of the United States Patent and Trademark Office*